United States Patent
Tanimura et al.

(10) Patent No.: US 8,805,207 B2
(45) Date of Patent: Aug. 12, 2014

(54) DISTORTION COMPENSATOR, OPTICAL RECEIVER, DISTORTION COMPENSATOR AND OPTICAL RECEIVER CONTROLLING METHODS, AND OPTICAL TRANSMISSION SYSTEM

(71) Applicant: Fujitsu Limited, Kawasaki (JP)

(72) Inventors: Takahito Tanimura, Kawasaki (JP); Takeshi Hoshida, Kawasaki (JP); Hisao Nakashima, Kawasaki (JP); Shoichiro Oda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/764,299

(22) Filed: Feb. 11, 2013

(65) Prior Publication Data

US 2013/0148967 A1 Jun. 13, 2013

Related U.S. Application Data

(63) Continuation of application No. 12/543,154, filed on Aug. 18, 2009, now Pat. No. 8,447,186.

(30) Foreign Application Priority Data

Aug. 19, 2008 (JP) .................................. 2008-211196

(51) Int. Cl.
| | |
|---|---|
| *H04B 10/06* | (2006.01) |
| *H04B 1/12* | (2006.01) |
| *H03F 3/08* | (2006.01) |
| *H04B 10/69* | (2013.01) |
| *H04B 10/2513* | (2013.01) |
| *H04J 14/06* | (2006.01) |

(52) U.S. Cl.
CPC . *H04J 14/06* (2013.01); *H04B 1/12* (2013.01); *H03F 3/08* (2013.01); *H04B 2210/252* (2013.01); *H04B 10/697* (2013.01); *H04B 10/25133* (2013.01)
USPC ............................ 398/202; 398/159; 398/205

(58) Field of Classification Search
USPC .......... 398/158–159, 192–194, 208, 202, 205
See application file for complete search history.

(56) References Cited

U.S. PATENT DOCUMENTS

| | | | |
|---|---|---|---|
| 6,901,121 B1 | 5/2005 | Dubrovin et al. | |
| 7,684,712 B1 * | 3/2010 | Roberts et al. ................ | 398/208 |
| 2004/0037522 A1 * | 2/2004 | Sutehall et al. ................ | 385/113 |
| 2004/0037572 A1 | 2/2004 | Matsuyama | |
| 2004/0197103 A1 * | 10/2004 | Roberts et al. ................ | 398/159 |
| 2005/0052255 A1 * | 3/2005 | Chiang ......................... | 333/18 |

(Continued)

OTHER PUBLICATIONS

Kazuro Kikuchi, "EiectronicPost-compensation for Nonlinear Phase Fluctuations in a 1000-km 20Gbit/s Optical Quadrature Phase-shift Keying Transmission System Using the Digital Coherent Receiver" Optics Express, vol. 16, No. 2, pp. 889-896, Jan. 2008.

(Continued)

*Primary Examiner* — Dzung Tran
(74) *Attorney, Agent, or Firm* — Staas & Halsey LLP

(57) ABSTRACT

A distortion compensator, an optical receiver and a transmission system including an operation selectively compensating for linear waveform distortion exerted on an optical signal via a plurality of distortion compensators and compensating for nonlinear waveform distortion exerted on the optical signal using nonlinear distortion compensators.

6 Claims, 16 Drawing Sheets

(56) References Cited

U.S. PATENT DOCUMENTS

2006/0239387 A1 10/2006 Orihashi et al.
2009/0324224 A1* 12/2009 Xie .................................. 398/65
2010/0296821 A1 11/2010 Elbers et al.

OTHER PUBLICATIONS

European Search Resort for related application 09010661.8-1233 dated Dec. 8, 2009.

David Falconer, et al., "Frequency Domain Equalization for Single-Carrier Broadband Wireless Systems", IEEE Communications Magazine, Apr. 2002, pp. 58-66.
Notice of Allowance issued on Jan. 31, 2013 in copending U.S. Appl. No. 12/543,154.
Final Office Action issued on Oct. 11, 2012 in copending U.S. Appl. No. 12/543,154.
Office Action issued on May 4, 2012 in copending U.S. Appl. No. 12/543,154.
U.S. Appl. No. 12/543,154, filed Aug. 18, 2009, Takahito Tanimura, Fujitsu Limited.

* cited by examiner

DISTORTION COMPENSATOR, OPTICAL RECEIVER, DISTORTION COMPENSATOR AND OPTICAL RECEIVER CONTROLLING METHODS, AND OPTICAL TRANSMISSION SYSTEM

CROSS-REFERENCE TO RELATED APPLICATIONS

This application is a U.S. continuation application filed under 37 USC 1.53 claiming priority benefit of U.S. Ser. No. 12/543,154 filed in the United States on Aug. 18, 2009, which is based upon and claims the benefit of priority of the prior Japanese Patent Application No. 2008-211196, filed on Aug. 19, 2008, the disclosures of which are incorporated herein by reference.

BACKGROUND

1. Field

The present invention relates to a distortion compensator, an optical receiver, distortion compensator and optical receiver controlling methods and an optical transmission system. More specifically, the present invention includes a technique of compensating for waveform distortion generated in an optical transmission line and a device implementing same.

2. Description of the Related Art

In communication networks, optical communication using an optical fiber as an optical transmission line is being frequently used. In order to cope with a recently promoted increase in volume of information flowing through a network, increases in distance and capacity of an optical transmission system used are now being requested. However, waveform distortion exerted on light in an optical fiber is one of factors that restricts the increases in transmission distance and capacity of an optical transmission system. The waveform distortion exerted on light is generally classified into linear distortion and nonlinear distortion. Primary chromatic dispersion and primary polarization mode dispersion are included in the linear distortion. Both the linear distortion and the nonlinear distortion are compensated for in an optical receiver that receives an optical signal from an optical transmission line. The linear distortion may be compensated for by using a digital coherent technique in an optical receiver that receives an optical signal which has been transmitted through an optical fiber. Self phase modulation is included in the nonlinear distortion. Compensation for nonlinear distortion which is realized in an optical receiver is described, for example, in "Optical Express 16, pp 889-896 (2008), by Kazuo Kikuchi".

According to the technique described in the above mentioned literature, nonlinear distortion generated in an optical fiber is compensated for in an optical receiver. However, as will be described in detail below, the accuracy in compensation is limited.

SUMMARY

According to embodiment(s) of the present invention, there are provided a distortion compensator and an optical receiver. Each of the distortion compensator and the optical receiver is of a type inputting thereinto an electric signal obtained by photoelectric-converting an optical signal received from an optical transmission line and includes a configuration in which a plurality of distortion compensating sections (distortion compensators). Each has linear distortion compensating sections (linear distortion compensators) compensating for linear waveform distortion exerted on the optical signal and nonlinear distortion compensating sections (nonlinear distortion compensators) compensating for nonlinear waveform distortion exerted on the optical signal, are cascade-connected with one another.

According to embodiment(s) of the present invention, there are also provided a distortion compensator controlling method and an optical receiver controlling method, each including a distortion compensating operation having a linear distortion compensating operation compensating for linear waveform distortion exerted on an optical signal and a nonlinear distortion compensating operation compensating for nonlinear waveform distortion exerted on the optical signal respectively based on an electric signal obtained by photoelectric-converting the optical signal received from an optical transmission line, and an executing operation executing the distortion compensating operation a plurality of times.

According to embodiment(s) of the present invention, there are further provided a distortion compensator controlling method and an optical receiver controlling method, each including a distortion compensating operation having an operation compensating for linear waveform distortion exerted on an optical signal and an operation compensating for nonlinear waveform distortion exerted on the optical signal respectively based on an electric signal obtained by photoelectric-converting the optical signal received from an optical transmission line and information obtained from an optical transmission line network control unit, and an executing operation executing the distortion compensating operation a plurality of times.

According to an embodiment of the present invention, there is further provided an optical transmission system controlling the operation of the distortion compensator by the above mentioned distortion compensator controlling method and controlling the operation of the optical receiver by the above mentioned optical receiver controlling method.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION OF EMBODIMENTS

Figure 1:
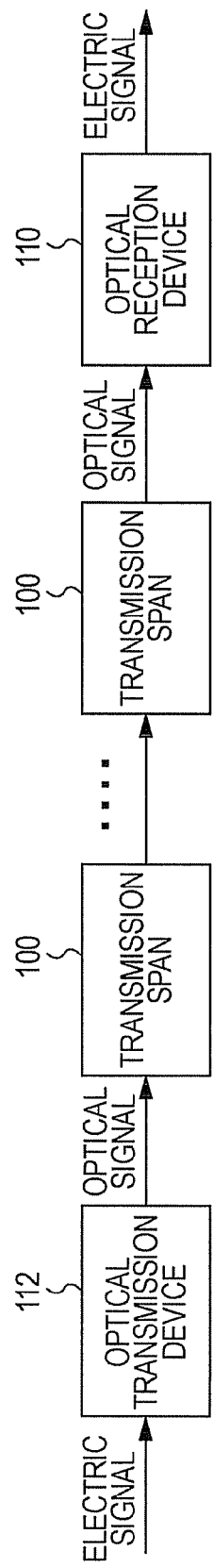
FIG. 1 is a block diagram illustrating an optical transmission system according to an embodiment of the present invention.

Reference will now be made in detail to the embodiments, examples of which are illustrated in the accompanying drawings, wherein like reference numerals refer to the like elements throughout. The embodiments are described below to explain the present invention by referring to the figures.

Next, preferred embodiments of the present invention will be described with reference to the accompanying drawings.

FIG. 1 is a block diagram illustrating an optical transmission system. In the optical transmission system illustrated in FIG. 1, an optical transmission device 112 converts an electric signal to an optical signal and outputs the converted optical signal to an optical transmission line. The optical transmission line has a plurality of cascade-connected transmission spans 100. The transmission span 100 at the first stage receives the optical signal sent from the optical transmission device 112. The optical signal is propagated through a plurality of stages of transmission spans 100 which are installed in the midst of the transmission line. Then, the transmission span 100 at the final stage propagates the optical signal to an optical reception device (optical receiver) 110. The optical receiving device 110 converts the optical signal to an electric signal and outputs the converted electric signal.

Figure 2:
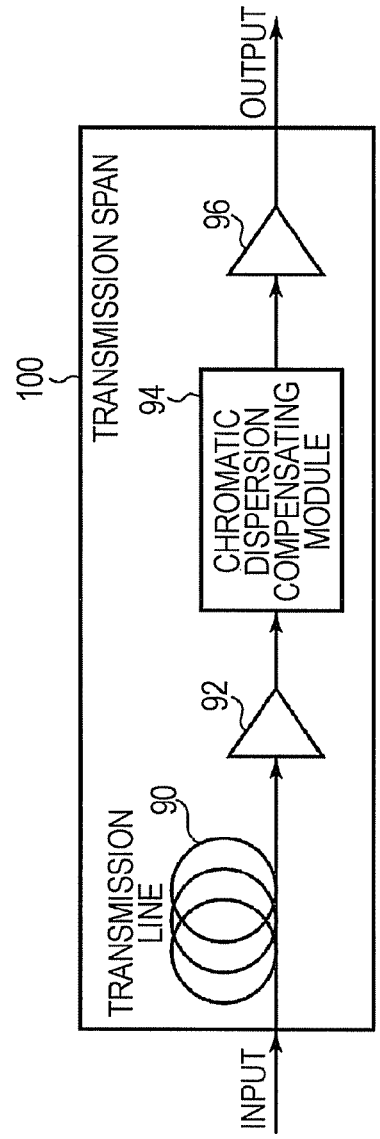
FIG. 2 is a block diagram illustrating a transmission span.

FIG. 2 is a block diagram illustrating an example of the transmission span 100. One transmission span 100 includes a transmission line 90, optical amplifiers 92 and 96, and a chromatic dispersion compensating module 94. The transmission line 90 is, for example, an optical fiber. The optical amplifiers 92 and 96 are, for example, rare-earth added fiber optic amplifiers or Raman amplifiers and amplify an optical signal which has been attenuated in the transmission line 90. The chromatic dispersion compensating module 94 compensates for chromatic dispersion generated in the transmission line 90.

Figure 3:
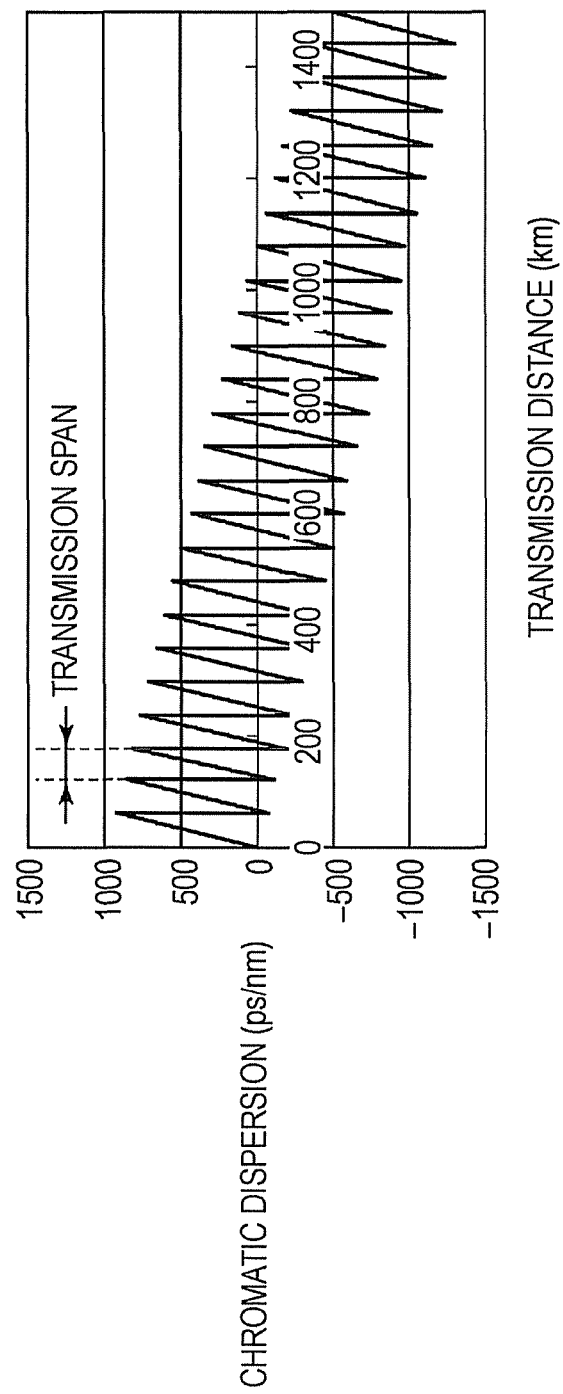
FIG. 3 is a schematic diagram illustrating chromatic dispersion relative to a transmission distance of an optical transmission system.
Figure 4:
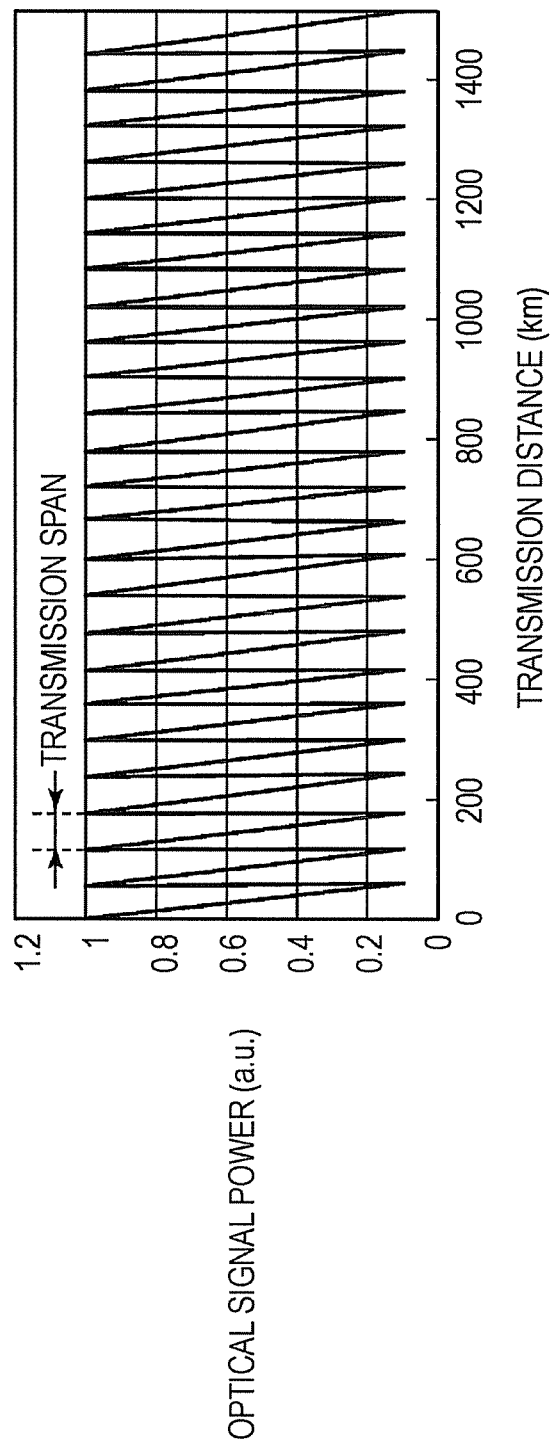
FIG. 4 is a schematic diagram illustrating optical signal power relative to a transmission distance of an optical transmission system.

FIG. 3 is a schematic diagram illustrating chromatic dispersion relative to a transmission distance of an optical transmission system. The more the transmission distance over which the optical signal is transmitted through the transmission line 90 is increased, the more the chromatic dispersion is increased. The chromatic dispersion compensating module 94 compensates for the chromatic dispersion so increased. FIG. 4 is a schematic diagram illustrating optical signal power relative to a transmission distance. In FIG. 4, the vertical axis indicates a standardized logarithm of the optical signal power. The more the transmission distance over which the optical signal is transmitted through the transmission line 90 is increased, the more the optical signal power is attenuated. The optical amplifiers 92 and 96 amplify an optical signal of one wavelength or a wavelength-multiplexed optical signal to compensate for the attenuated optical signal power. For the convenience of explanation, FIGS. 3 and 4 illustrate examples in which it is assumed that all the transmission spans 100 exhibit the same chromatic dispersion value and the optical signal power value. However, in an actually installed optical transmission system, the characteristic and a length of an optical fiber of the transmission line 90, an amount by which a signal is chromatic-dispersed (hereinafter, referred to as a chromatic dispersion amount) and an amount by which a signal is attenuated (hereinafter, referred to as an attenuation amount) in the transmission line 90, an amount by which chromatic dispersion is compensated for (hereinafter, referred to as a chromatic dispersion compensation amount) of the chromatic dispersion compensating module 94 and amounts by which the optical amplifiers 92 and 96 amplify signals (hereinafter, referred to as amplification amounts) of the optical amplifiers 92 and 96 may be different for different transmission spans 100.

Figure 5:
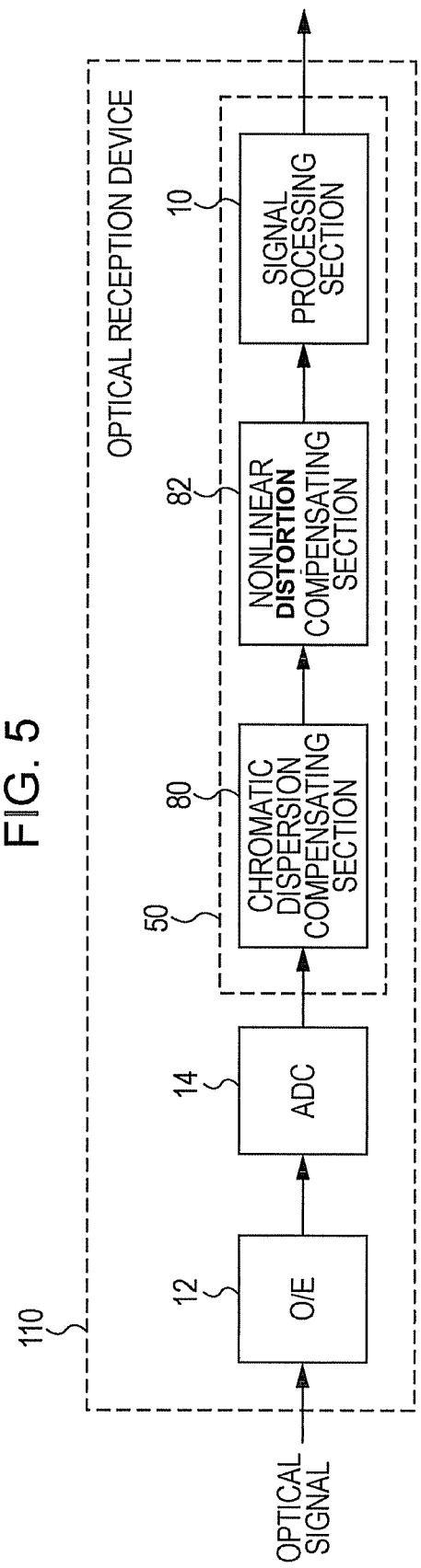
FIG. 5 is a block diagram illustrating an optical reception device.

Next, an optical reception device (optical receiver) performing nonlinear distortion compensation explained in the above mentioned literature, that is, "Optical Express 16, pp 889 to 896 (2008)" will be described as a comparative example. FIG. 5 is a block diagram of an optical reception device (optical receiver) as the comparative example. In FIG. 5, the optical reception device 110 inputs thereto an optical signal. A photoelectric converter (O/E) 12 converts the optical signal to an electric signal. An ADC (Analog Digital Converter) 14 converts the analog electric signal to a digital electric signal. The digital electric signal is processed using a digital processing section 50. The digital processing section 50 has a chromatic dispersion compensating section (a chromatic dispersion compensator) 80, a nonlinear distortion compensating section (a nonlinear distortion compensator) 82 and a signal processing section 10. The chromatic dispersion compensating section 80 compensates for linear waveform distortion which has been generated in the transmission span 100. The nonlinear distortion compensating section 82 compensates for nonlinear waveform distortion which has been generated in the transmission span 100. The signal processing section 10 performs signal processing such as frequency offset compensation and phase synchronization on an electric signal which has been subjected to distortion compensation and outputs the electric signal so subjected to signal processing.

Figure 6:
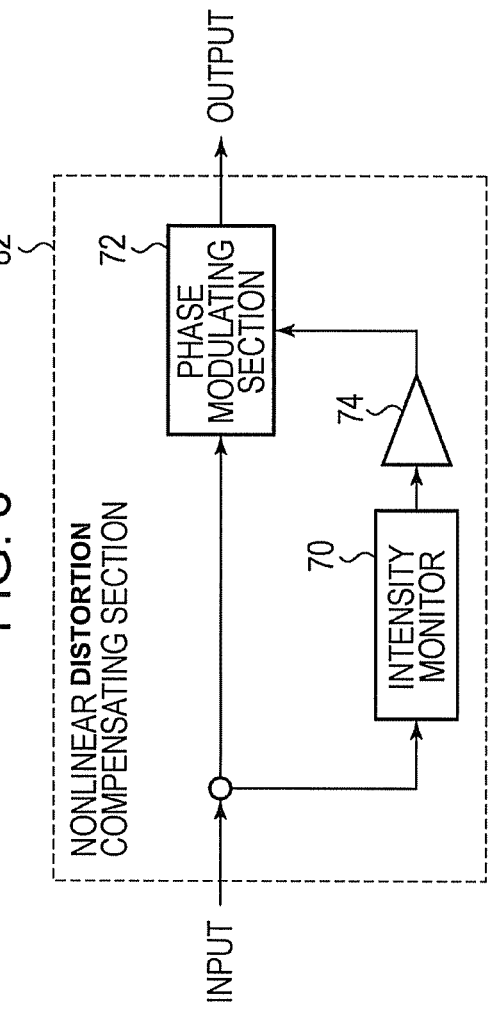
FIG. 6 is a block diagram illustrating a nonlinear distortion compensating section.

FIG. 6 is a functional block diagram illustrating an example of the nonlinear distortion compensating section 82. The nonlinear distortion compensating section 82 has a function of compensating for nonlinear distortion such as self phase modulation. The self phase modulation is nonlinear distortion of the type that when the power of an optical signal is increased in an optical fiber, phase modulation is induced in accordance with the optical signal power so increased. Thus, an intensity monitor 70 monitors the intensity of an electric signal corresponding to the optical signal so increased in power. An amplifier 74 amplifies an intensity signal sent from the intensity monitor 70 and outputs the amplified intensity signal to a phase modulating section 72. The phase modulating section 72 performs phase modulation in accordance with the intensity signal so as to compensate for the nonlinear waveform distortion generated in the transmission span 100. The phase modulating section 72 may perform phase modulation including according to an equation (5) described in the above mentioned literature. In the above mentioned manner, the self phase modulation generated in the transmission span 100 is compensated for.

Figure 7:
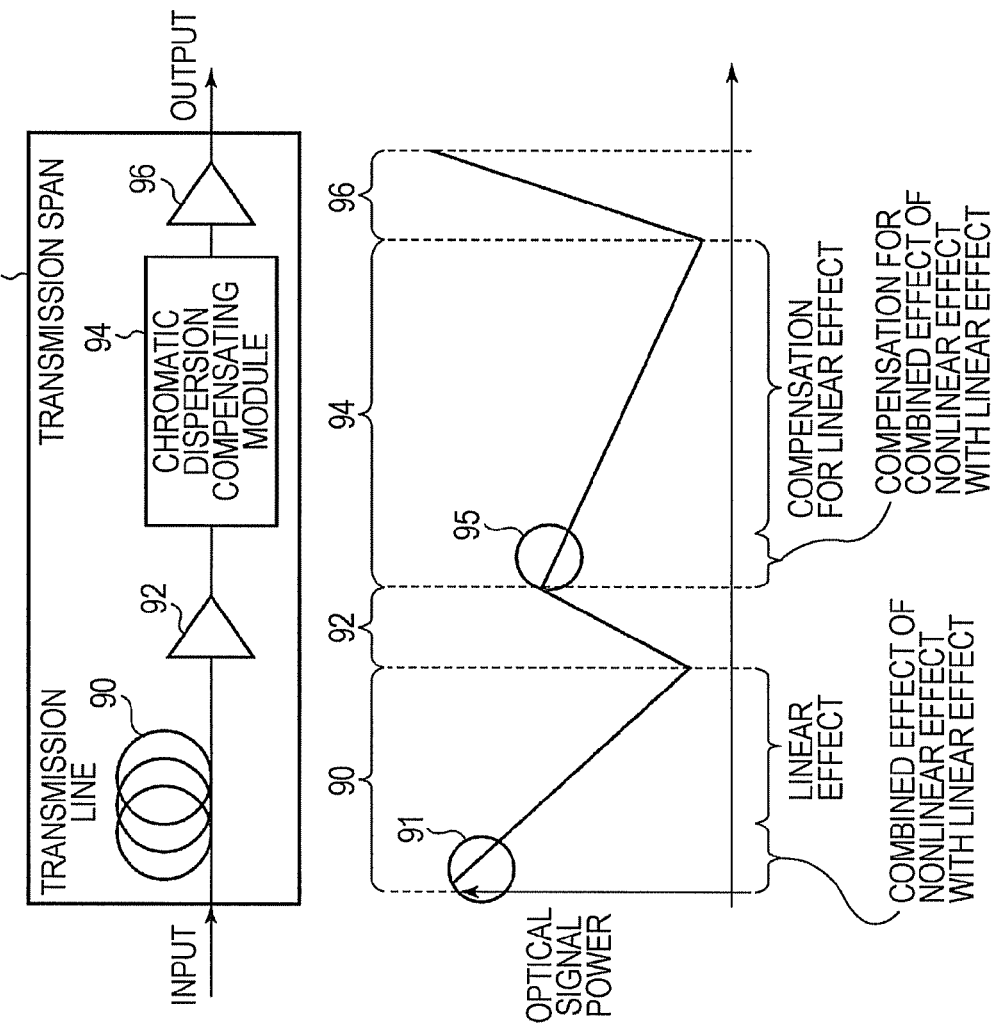
FIG. 7 is a diagram illustrating optical signal power in a transmission span.

However, distortion compensation realized using the optical reception device described in the comparative example is insufficient. FIG. 7 illustrates a relation among optical signal power, distortion effect and distortion compensation in a transmission span 100. In the drawing, the horizontal axis indicates a direction in which an optical signal is transmitted and the vertical axis indicates the optical signal power. In the transmission line 90 illustrated in FIG. 7, as the optical signal power is uniformly attenuated, linear distortion effect (for example, chromatic dispersion) is uniformly generated. Nonlinear distortion effect such as the self phase modulation is generated when the optical signal power is high. In a region 91 on the input side of the transmission line 90, the optical signal power is high, so that the rate at which both the linear distortion effect and the nonlinear effect are generated is high. The optical amplifier 92 amplifies the optical signal power. The chromatic dispersion compensating module 94 attenuates the optical signal power and compensates for the linear distortion effect. The optical signal power is high in a region 95 on the input side of the chromatic dispersion compensating module 94 and hence nonlinear distortion effect is generated. The optical amplifier 96 amplifies the optical signal power.

As described above, in the actually installed optical transmission system, combined effect of nonlinear distortion effect with linear distortion effect and single effect of the linear distortion effect are alternately generated. Therefore, compensation for distortion, in particular, compensation for nonlinear distortion may not be performed with accuracy by a method in which linear distortion generated in a plurality of spans 100 is compensated for at one time and then nonlinear distortion is compensated for as in the comparative example illustrated in FIG. 5. An optical reception device (optical receiver) and an optical receiving method according to embodiment(s) of the present invention have been made in view of the above mentioned circumstances.

Figure 8:
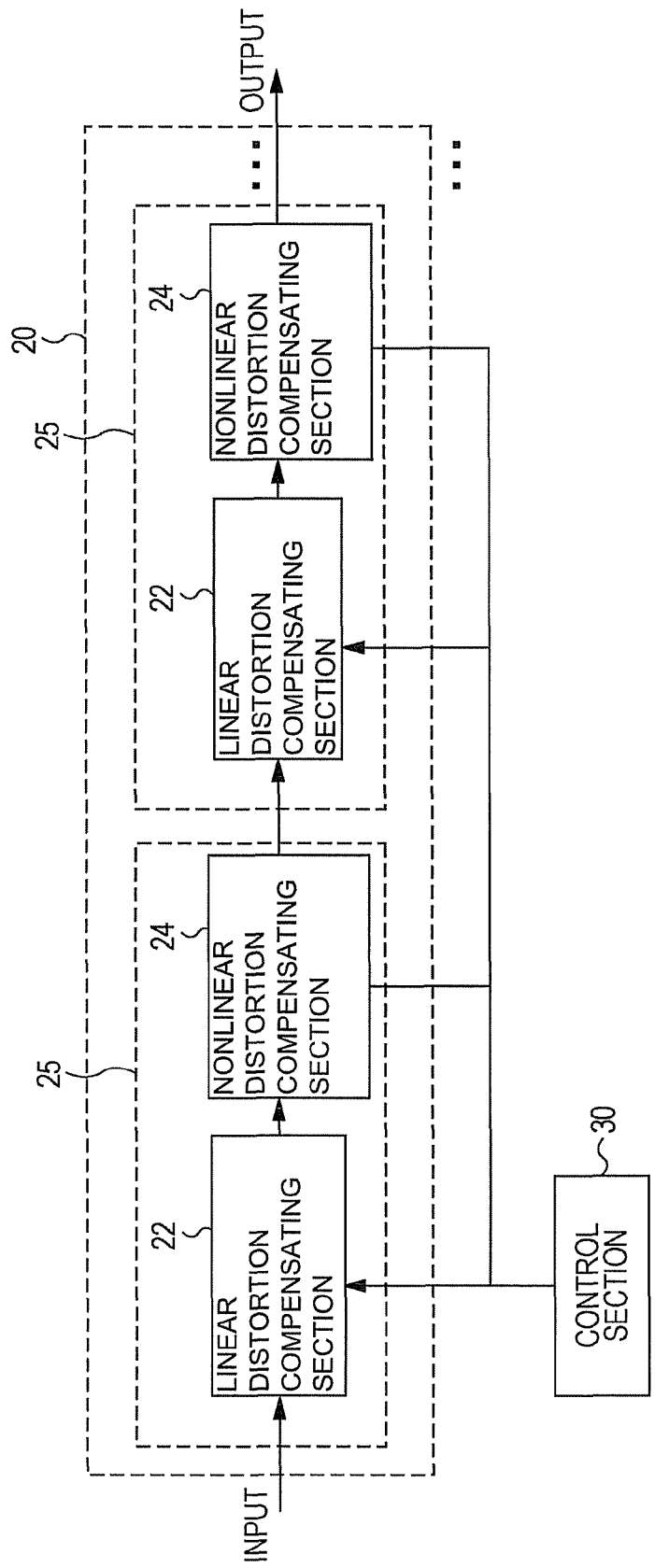
FIG. 8 is a block diagram illustrating a multistage distortion compensating section according to an embodiment of the present invention.

FIG. 8 is a block diagram illustrating an example of a distortion compensator 20 installed in the optical reception device according to an embodiment of the present invention. The distortion compensator 20 is installed in place of the chromatic dispersion compensating section 80 and nonlinear distortion compensating section 82 illustrated in FIG. 5. The distortion compensator 20 has a plurality of linear distortion compensating sections (linear distortion compensators) 22 and a plurality of nonlinear distortion compensating sections 24. One linear distortion compensating section 22 is paired with one nonlinear distortion compensating section 24 to form a one-stage distortion compensating section (distortion compensator) 25. The distortion compensator 20 has a configuration in which a plurality of (multistage) distortion compensating sections 25 are cascade-connected with one another. Thus, in the following description, the distortion compensator 20 will be referred to as a multistage distortion compensating section (distortion compensator) as the case may be. The plurality of distortion compensating sections 25 are cascade-connected with one another in a multistage form, so that the linear distortion compensating sections 22 and the nonlinear compensating sections 24 are alternately arranged. That is, the multistage compensating section 20 alternately performs linear distortion compensation and nonlinear distortion compensation on a signal which has been input thereinto and outputs a signal so subjected to distortion compensation. A control section 30 controls the operations of the linear distortion compensating sections 22 and the nonlinear distortion compensating sections 24 to optimize later described coefficients. As an alternative, a configuration including the distortion compensator 20 and the control section 30 may be defined as a distortion compensator. In other words, the distortion compensator has a configuration having the multistage distortion compensating section 20 and the control section 30.

As described in relation to the comparative example illustrated in FIG. 7, the combined effect of nonlinear distortion effect with linear distortion effect and single effect of linear distortion effect are alternately generated in the transmission span 100. Therefore, highly accurate distortion compensation is realized by alternately performing compensation for the combined effect of nonlinear distortion effect with linear distortion effect and compensation for the single effect of linear distortion effect as illustrated in FIG. 8.

For example, in FIG. 7, in the case that the intensity of the optical signal to be input into the chromatic dispersion compensating module 94 is not high, nonlinear distortion effect is generated on the input side 91 of the transmission line 90 in one transmission span 100. In the transmission system in which a plurality of the transmission spans 100 of the above mentioned type are connected with one another, the linear distortion compensating sections 22 and the nonlinear distortion compensating sections 24 are alternately connected with one another in the multistage distortion compensating section 20 and, for example, a number of stages of the distortion compensating sections (distortion compensators) 25 in the multistage distortion compensating section 20 may be made the same as that of the transmission spans 100. However, the number of stages of the distortion compensating sections 25 may be either larger or smaller than that of the transmission spans 100. The distortion compensating section 25 realizes highly accurate compensation without being limited to a reverse propagation form of the transmission line. Thus, the number of stages of the distortion compensating sections 25 may be set to an arbitrary value simply by taking balance between compensation accuracy and complexity imposed upon mounting into consideration, regardless of the actual configuration of the transmission line.

In the case that the intensity of the optical signal to be input into the chromatic dispersion compensating module 94 is high, the nonlinear distortion effect, the linear distortion effect and, then, the nonlinear distortion effect are sequentially generated in one transmission span 100. Thus, in the above mentioned case, two nonlinear distortion compensating sections 24 may be installed corresponding to the characteristics of the transmission span 100 used. That is, each one or more linear distortion compensating sections 22 and nonlinear distortion compensating sections 24 may be installed corresponding to the order in which the nonlinear distortion effect and the linear distortion effect are generated in a transmission span 100.

On the other hand, in the case that the power of the optical signal to be input into the transmission line 90 is low or a fiber used as the transmission line is of the kind having a low nonlinear coefficient, the nonlinear distortion effect generated in the transmission line 90 may be disregarded. In the above mentioned case, only the linear distortion compensating sections 22 may be installed corresponding to the characteristics of the transmission span 100 used, with no installation of the nonlinear distortion compensating section 24. In the case that a rear excitation Raman amplifier is used as the optical amplifier, light is incident from the output side of the transmission line 90 and hence nonlinear distortion effect is generated on both the output side and the input side of the transmission line 90. In this case, more highly accurate compensation for the nonlinear distortion is realized by providing three or more nonlinear distortion compensating sections 24 corresponding to the characteristics of the transmission span 100 used.

As described above, combination of the linear distortion compensating sections 22 with the nonlinear distortion compensating sections 24 may be set so as to optimize distortion compensation performed using the multistage distortion compensating section 20, not limited to the above mentioned examples and not limited to a situation where the combination is to be set so as to conform to the characteristics of the actually installed transmission line.

In the optical reception device illustrated in FIG. 8, an electric signal which has been converted from an optical signal received from the optical transmission line is input into the multistage distortion compensating section 20. In the multistage distortion compensating section 20, a plurality of distortion compensating sections 25 are cascade-connected with one another. The distortion compensating section 25 has the linear distortion compensating section 22 compensating for linear waveform distortion exerted on an optical signal and the nonlinear distortion compensating section 24 compensating for nonlinear waveform distortion exerted on the optical signal. Owing to the above mentioned arrangement, highly accurate distortion compensation is realized. In addition, a distortion compensating section in which two or more nonlinear distortion compensating sections 24 are installed and a distortion compensating section made up of only the linear distortion compensating section 22 may be included in the multistage distortion compensating section 20 as mentioned above.

Figure 9:
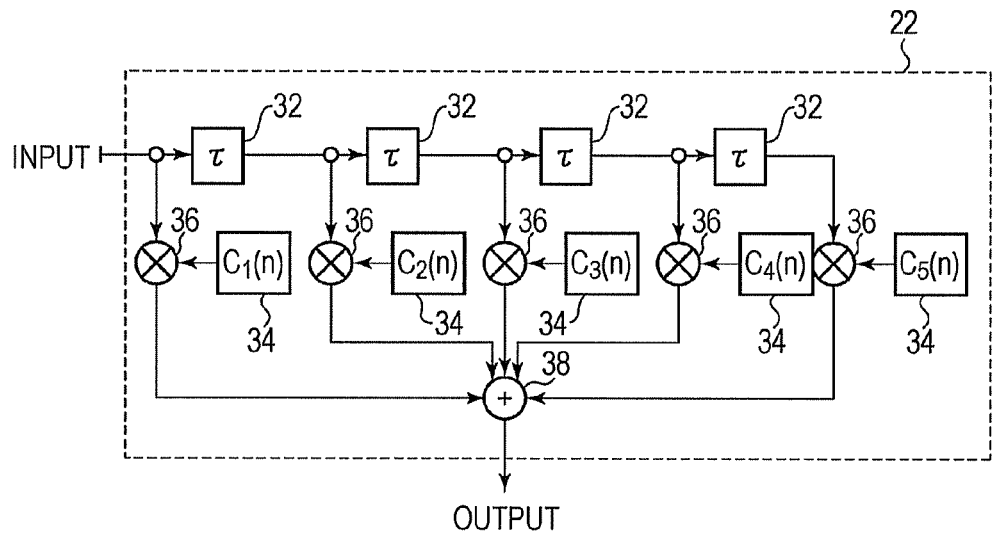
FIG. 9 is a block diagram illustrating one example of a linear distortion compensating section according to an embodiment of the present invention.

FIG. 9 is a block diagram illustrating an example of the linear distortion compensating section 22. In the example shown in FIG. 9, the number of stages of the multistage distortion compensating section 20 is "N" and the linear distortion compensating section 22 in the distortion compensating section 25 at an n-th stage is illustrated. In FIG. 9, the linear distortion compensating section 22 is an FIR (Finite Impulse Response) filter which includes a delay unit 32, an FIR coefficient 34, a multiplier 36 and an adder 38. The delay unit 32 delays each signal by a time τ. The multiplier 36 multiplies each delayed signal and an FIR coefficient Ck(n). Here, "k" is the number of coefficients and one to five coefficients are prepared in the example illustrated in FIG. 9. The number of coefficients may be arbitrarily set. The adder 38 adds each multiplied signal.

The coefficient Ck(n) is calculated, for example, using a numerical formula 1.

$$C_k = \frac{1}{2\pi}\int_{-\pi}^{\pi} \exp\left[\frac{i}{2}\left(\frac{\omega}{T_s}\right)^2 \frac{cD}{2\pi f} + i\omega k\right]d\omega \quad \text{Numerical Formula 1}$$

In the formula, "i" is an imaginary unit, "Ts" is a sampling time interval, "D" is a chromatic dispersion amount, "c" is a velocity of light and "f" is a frequency of carrier light. For example, the chromatic dispersion amount D may be set first at its initial value indicative of the amount of chromatic dispersion generated in a corresponding transmission span 100 and then may be adjusted so as to optimize distortion compensation performed using the multistage distortion compensating section 20.

Figure 10:
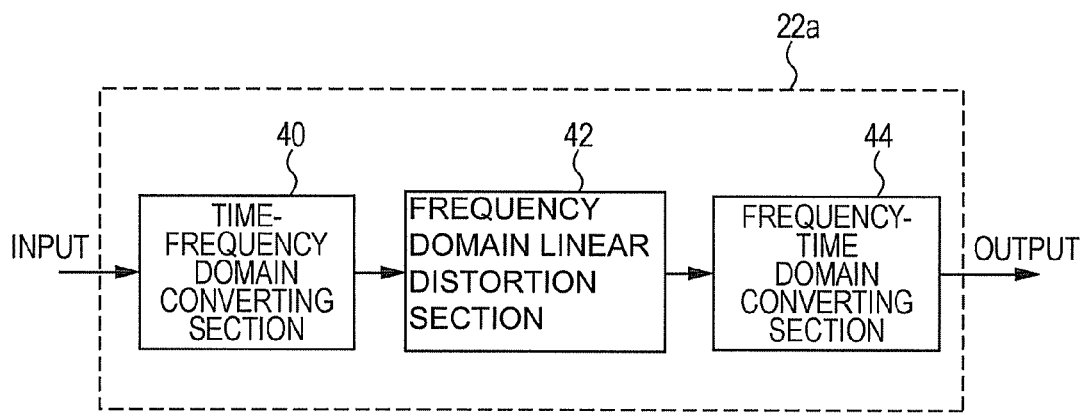
FIG. 10 is a block diagram illustrating another example of a linear distortion compensating section.

FIG. 10 is a block diagram illustrating another example of the linear distortion compensating section 22. In FIG. 10, the linear distortion compensating section 22 includes a time-frequency domain converting section 40, a frequency domain linear distortion compensating section 42 and a frequency-time domain converting section 44. The time-frequency domain converting section 40 performs FFT (Fast Fourier Transform) on an input signal to convert the signal to a signal indicative of a frequency domain. The frequency domain linear distortion compensating section 42 performs linear distortion compensation in the frequency domain. The frequency-time domain converting section 44 performs inverse FFT on the signal so subjected to linear distortion compensation to convert the signal to a signal indicative of a time domain. As mentioned above, linear distortion compensation may be performed in the frequency domain. Incidentally, as the time-frequency domain converting section 40, the frequency domain linear distortion compensating section 42 and the frequency-time domain converting section 44, components described, for example, in "IEEE Communication Magazine, April 2002, pp 58-66" may be used.

As mentioned above, at least one of the linear distortion compensating sections 22 may be formed as a linear distortion compensating section that compensates for chromatic dispersion of the optical signal which has been output from the optical transmission line. In addition, an FIR filter may be used as at least one of the linear distortion compensating sections 22 as illustrated in FIG. 9. Likewise, an IIR (Infinite Impulse Response) filter may be used. Further, a frequency domain filter may be used as at least one of the linear distortion compensating sections 22 as illustrated in FIG. 10.

Figure 11:
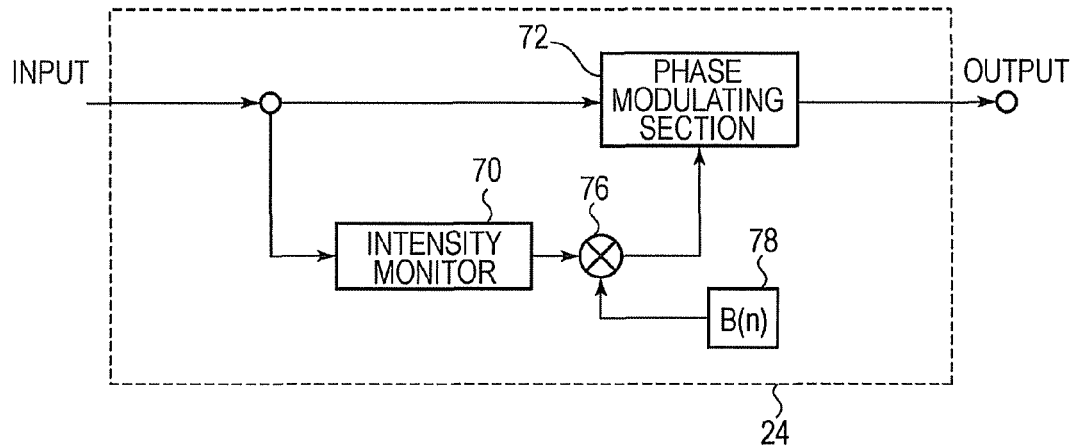
FIG. 11 is a block diagram illustrating an example of a nonlinear distortion compensating section according to an embodiment of the present invention.

FIG. 11 is a block diagram illustrating an example of the nonlinear distortion compensating section 24. FIG. 11 illustrates the nonlinear distortion compensating section 24 of the distortion compensating section 25 at an n-th ("n" is an arbitrary positive integer) stage. In FIG. 11, the nonlinear distortion compensating section 24 is a self phase modulation compensator including the intensity monitor 70, the phase modulating section 72, a multiplier 76 and a nonlinear coefficient 78. The multiplier 76 multiplies an output from the intensity monitor 70 and the nonlinear coefficient b(n) 78 and outputs a result of multiplication to the phase modulating section 72. The arrangement other than the above is the same as that in FIG. 6 and hence description thereof will be omitted.

As the nonlinear coefficient b(n) 78, for example, a coefficient (γ1) eff in the equation 5 described in "Optical Express 16" may be used. In addition, a coefficient b (n) determined by using the following numerical formula 2 obtained by further generalizing the above mentioned equation 5 may be used as an initial value and then the coefficient b(n) may be adjusted so as to optimize nonlinear distortion compensation performed using the multistage distortion compensating section 20.

$$b(n) = A \int_0^1 \gamma(z)p(z)dz \qquad \text{Numerical Formula 2}$$

In the formula, "A" is a constant, γ(z) is a coefficient of distortion, p(z) is an optical signal power, "z" is a position in a transmission span and "1" is a length of the transmission span.

As described above, at least some of the plurality of distortion compensating sections 25 may compensate for waveform distortion generated in a transmission line in accordance with a coefficient which has been calculated in advance such as the FIR coefficient 34 of the linear distortion compensating section 22 illustrated in FIG. 9 and the nonlinear coefficient b(n)78 of the nonlinear distortion compensating section 24 illustrated in FIG. 11.

In the above mentioned manner, at least one of the nonlinear distortion compensating sections 24 may be formed as a nonlinear distortion compensating section that compensates for phase modulation distortion exerted on an input signal based on the intensity of the input signal. The self phase modulation may be compensated for using the nonlinear distortion compensating section so formed.

Figure 12:
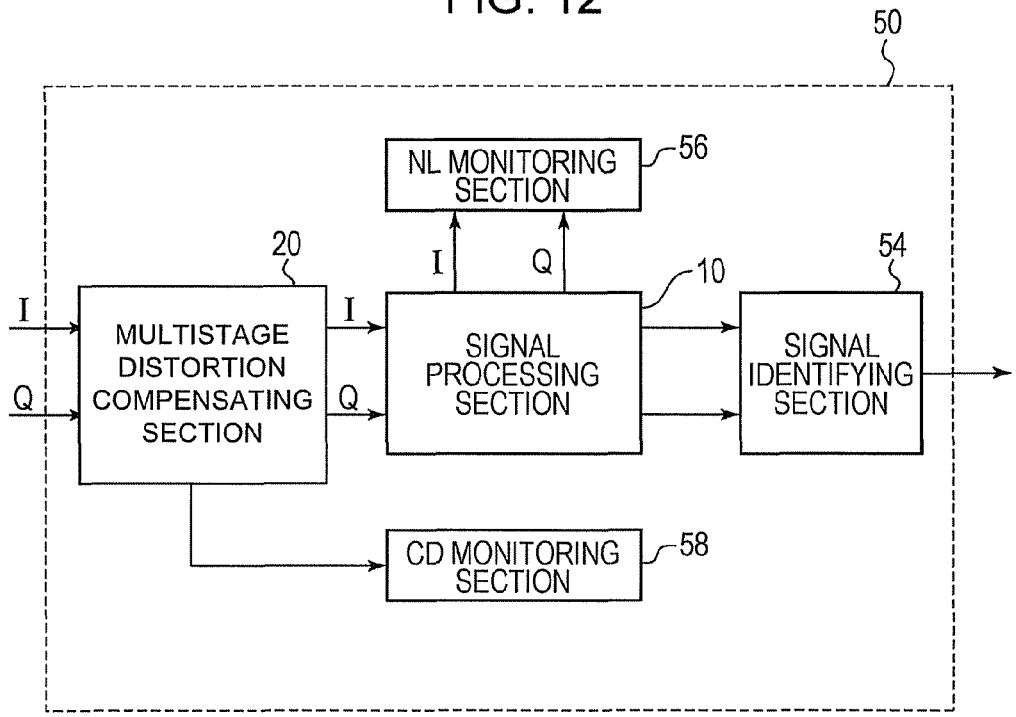
FIG. 12 is a block diagram illustrating a digital processing section.

FIG. 12 is a block diagram illustrating a digital processing section used in the case nonlinear distortion to be compensated for using the multistage distortion compensating section 20 is to be monitored. In FIG. 12, the digital processing section 50 includes the multistage distortion compensating section 20, the signal processing section 10, a signal identifying section (signal decision section) 54, an NL (Non-Linear) monitoring section 56 and a CD (Chromatic Dispersion) monitoring section 58. A/D converted I-phase and Q-phase signals are input into the digital processing section 50. The multistage distortion compensating section 20 performs linear distortion compensation and nonlinear distortion compensation on the input signals. The signal processing section 10 processes the signals in the same manner as that illustrated in FIG. 5. The signal decision section 54 identifies the processed signals. That is, the signal decision section 54 identifies as to whether the signal concerned is a control signal or a data signal. The NL monitoring section 56 monitors a nonlinear amount. The CD monitoring section 58 monitors a chromatic dispersion amount.

Figure 13:
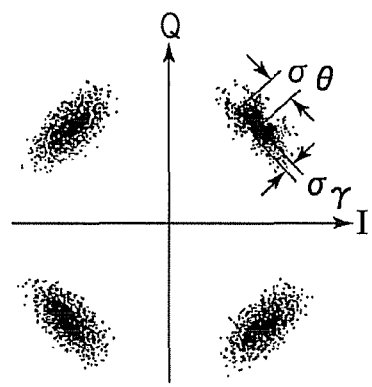
FIG. 13 is a constellation diagram illustrating nonlinear distortion.

An example of monitoring the nonlinear amount using the NL monitoring section 56 will be described. FIG. 13 is a constellation diagram illustrating a QPSK (Quadrature Phase Shift Keying) operation by way of example. A ratio of a deviation σr in an amplitude direction of a symbol to a deviation σθ in a phase direction thereof is used as the nonlinear amount FNL as expressed by the following numerical formula 3.

$$F_{NL} = \frac{\sigma_\theta}{\sigma_r} \qquad \text{Numerical Formula 3}$$

In the formula, as the nonlinear amount FNL is increased, nonlinearity is increased accordingly. For example, in the case that a signal sK obtained after execution of phase synchronization is expressed by a numerical formula 4, a mean amplitude r, a mean phase θ, the standard deviation σr in the amplitude direction and the standard deviation σθ in the phase direction are respectively expressed by numerical formula 5 to 8.

$$s_k = I_k + jQ_k \qquad \text{Numerical Formula 4}$$

In the formula, "Ik" is an amplitude of the I phase and "Qk" is an amplitude of the Q phase.

$$r = \frac{1}{N}\sum_{k=1}^{N} \sqrt{(I_k^2 + Q_k^2)} \qquad \text{Numerical Formula 5}$$

$$\theta = \frac{1}{N}\sum_{k=1}^{N} \tan^{-1}\left(\frac{Q_k}{I_k}\right) \qquad \text{Numerical Formula 6}$$

$$\theta = \frac{1}{N}\sum_{k=1}^{N} \tan^{-1}\left(\frac{Q_k}{I_k}\right) \qquad \text{Numerical Formula 7}$$

$$\sigma_\theta = \sqrt{\frac{1}{N}\sum_{k=1}^{N}\left(\tan^{-1}\left(\frac{Q_k}{I_k}\right) - \theta\right)^2} \qquad \text{Numerical Formula 8}$$

In the above mentioned manner, the nonlinear amount FNL may be monitored.

The control section 30 may adjust the nonlinear coefficient b(n) illustrated in FIG. 11 based on the monitored nonlinear amount FNL. For example, the control section 30 may adjust the nonlinear coefficient so as to minimize the nonlinear amount FNL. The details will be described in explanation of an embodiment.

Figure 14:
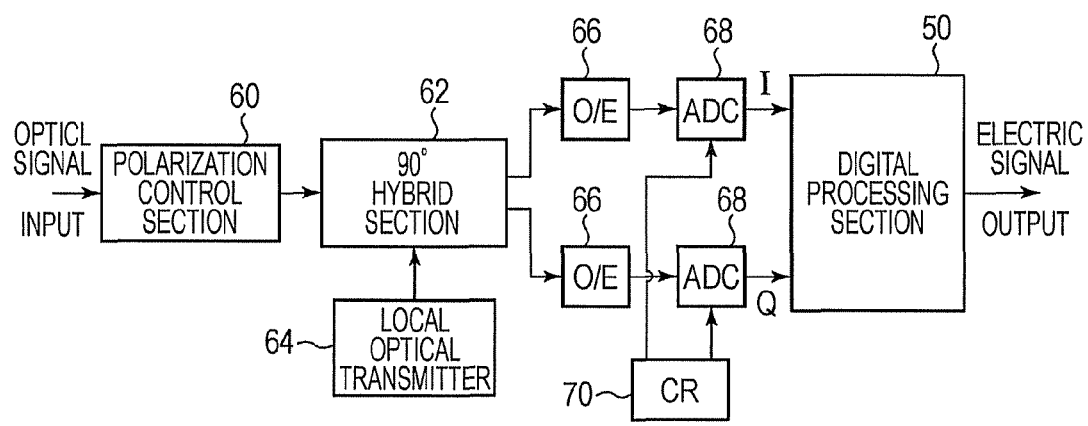
FIG. 14 is a block diagram illustrating an optical reception device according to an embodiment of the present invention.

FIG. 14 is a block diagram illustrating an example of an optical reception device (optical receiver) according to an embodiment of the present invention. In FIG. 14, an optical signal which has been received from an optical transmission line is input into a polarization control section 60. The optical signal is, for example, an mPSK signal. The polarization control section 60 outputs an optical signal oriented in a desired polarizing direction based on the input optical signal. A 90° hybrid section 62 detects the optical signal based on an oscillated optical signal sent from a local optical transmitter (local optical oscllator) 64 and outputs I-phase signal and Q-phase signal which are out of phase with each other by 90°. Each of photoelectric converters (O/Es) 66 converts the optical signal to an analog electric signal. Each of ADCs 68 converts the analog electric signal to a digital electric signal. The I-phase signal and the Q-phase signal which have been converted to digital electric signals are input into the digital processing section 50. The digital processing section 50 is the same as that illustrated in FIG. 12 and hence description thereof will be omitted. According to an embodiment of the present invention, a configuration in which the multistage distortion compensating section 20 described in relation to FIG. 8 is installed may be implemented in an optical reception device (optical receiver) of a digital form that processes single polarization.

Figure 15A:
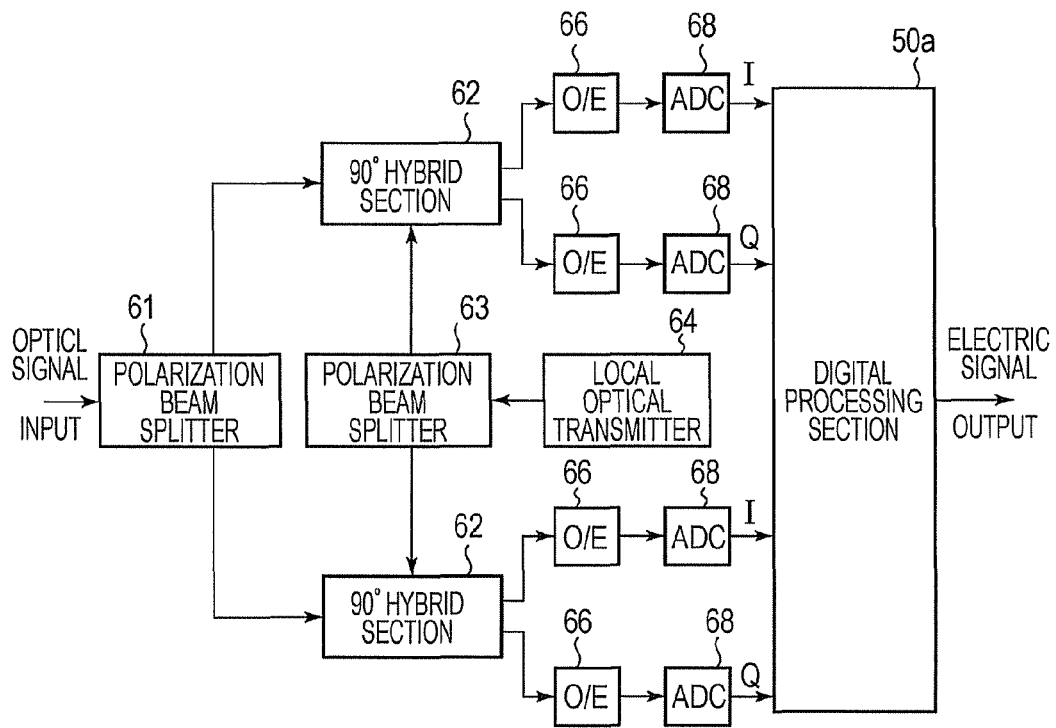
FIG. 15A is a block diagram illustrating an optical reception device according to an embodiment of the present invention.
Figure 15B:
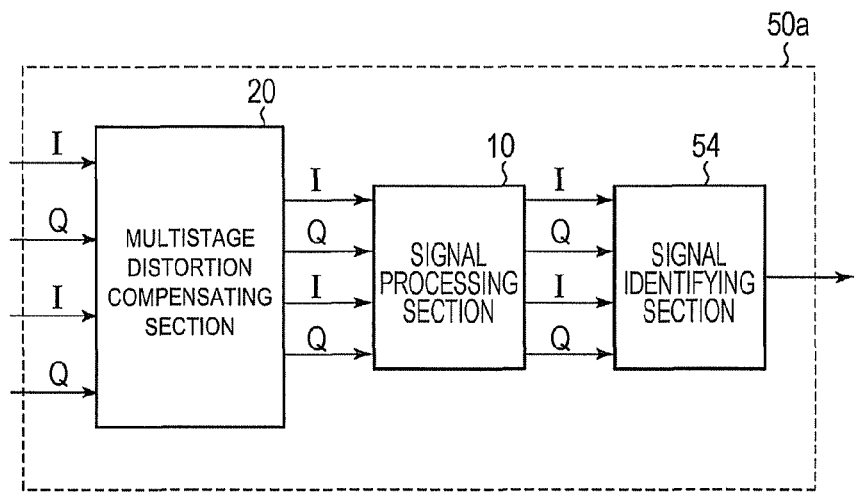
FIG. 15B is a block diagram illustrating an optical reception device according to an embodiment of the present invention.

Next, an example of a polarization diversity type optical reception device (a polarization diversity type optical receiver) according to an embodiment of the present invention will be described. FIG. 15A and FIG. 15B are block diagrams illustrating the example of the optical reception device according to an embodiment of the present invention. In FIG. 15A, an optical signal is input into a polarization beam splitter 61. The polarization beam splitter 61 divides the optical signal into optical signals oriented in two polarizing directions. A polarization beam splitter 63 divides an oscillated optical signal sent from the local optical oscillator 64 into optical signals oriented in two polarizing directions. Respective polarized optical signals are converted into I-phase and Q-phase digital electric signals using the 90° hybrid section 62, the O/E 66 and the ADC 68 and are input into a digital processing section 50a. As illustrated in FIG. 15B, the multistage distortion compensating section 20, the signal processing section 10 and the signal decision section (signal identifying section) 54 in the digital processing section 50a process I-phase and Q-phase signals in the respective polarized signals. The arrangement other than the above is the same as that illustrated in FIG. 12 and hence description thereof will be omitted. Incidentally, an NL monitoring section and a CD monitoring section are not illustrated.

Figure 16A:
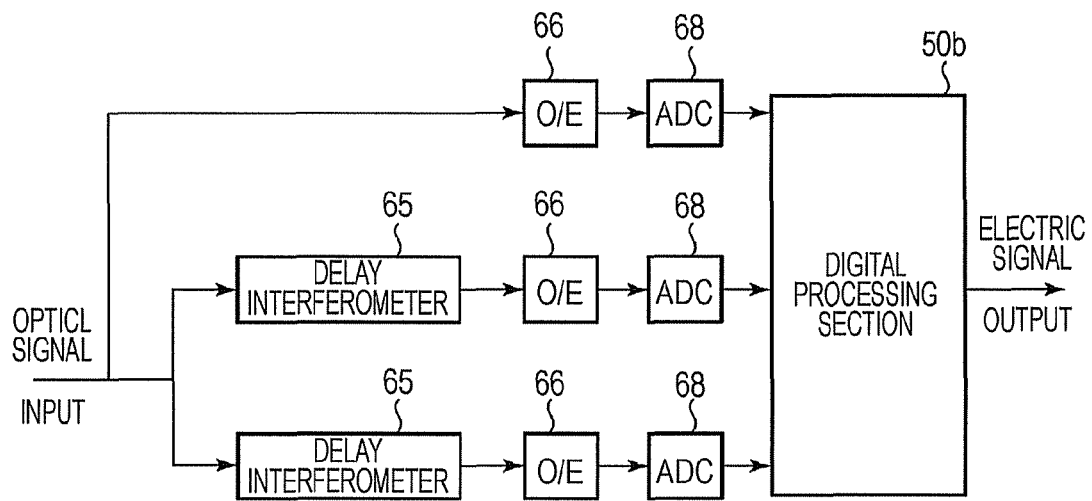
FIG. 16A is a block diagram illustrating an optical reception device according to an embodiment of the present invention.
Figure 16B:
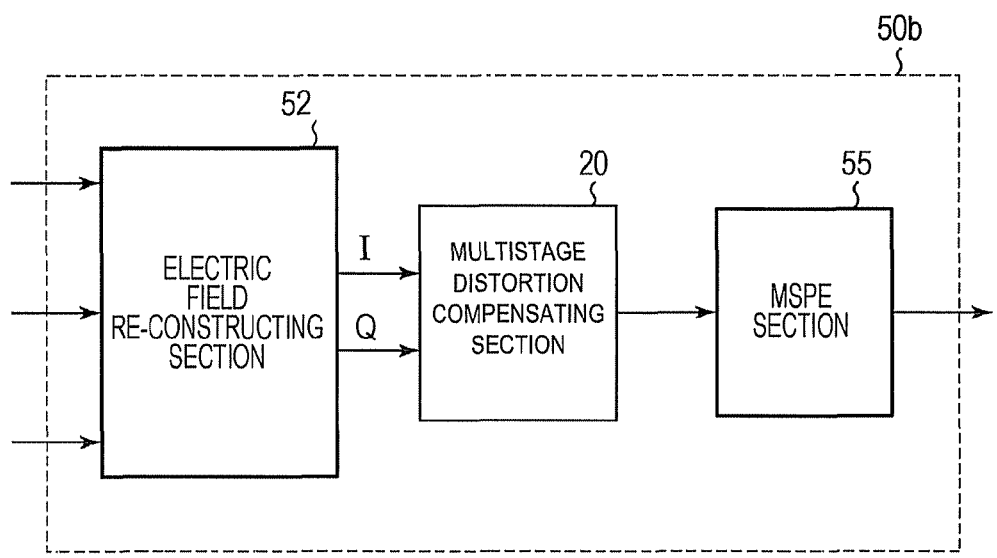
FIG. 16B is a block diagram illustrating the optical reception device according to an embodiment of the present invention.

FIG. 16A and FIG. 16B are block diagrams illustrating an example of a self-coherent type optical reception device (a self-coherent type optical receiver) according to an embodiment of the present invention. In FIG. 16A, an input optical signal is branched into three optical signals using a beam splitter (not shown). Two optical signals so branched are respectively input into delay interferometers 65. One of the delay interferometers 65 causes the optical signal to be subjected to self-delayed interference to extract an I-phase signal included in the optical signal. For example, the interferometer branches the input signal into two signals and delays one of the branched signals by one bit to make it interfere with another signal. Another delay interferometer 65 causes the optical signal to be subjected to self-delayed interference to extract a Q-phase signal included in the optical signal. The optical signals which haven been output from the delay interferometers 65 are respectively input into the O/Es 66. The last one of three branched optical signals is input into its corresponding O/E 66 as it is. The functions of the O/Es 66 and the ADCs 68 have already been explained, that is, are the same as those described in the above-described embodiment and hence description thereof will be omitted. Digital electric signals which have been output from the ADCs 68 are input into a digital processing section 50b.

As illustrated FIG. 16B, the digital processing section 50b includes an electric field reconstructing section 52, the multistage distortion compensating section 20 and an MSPE (Multi Symbol Phase Estimation) section 55. The electric field reconstructing section 52 performs processing necessary for reconstructing a complex photoelectric field from information in the received signal and outputs signals so subjected to processing as I-phase and Q-phase signals to the multistage distortion compensating section 20. The multistage distortion compensating section 20 performs distortion compensation on the electric signals which have been input thereinto and outputs an electric signal which has been subjected to distortion compensation to the MSPE section 55. The MSPE section 55 estimates a multi-symbol phase of the input signal and outputs a signal so estimated to a signal decision section (signal identifying section). The signal decision section identifies and outputs the received signal. According to an embodiment of the present invention, the multistage distortion compensating section according to an embodiment may be used in a self-coherent type optical digital receiver.

Figure 17A:
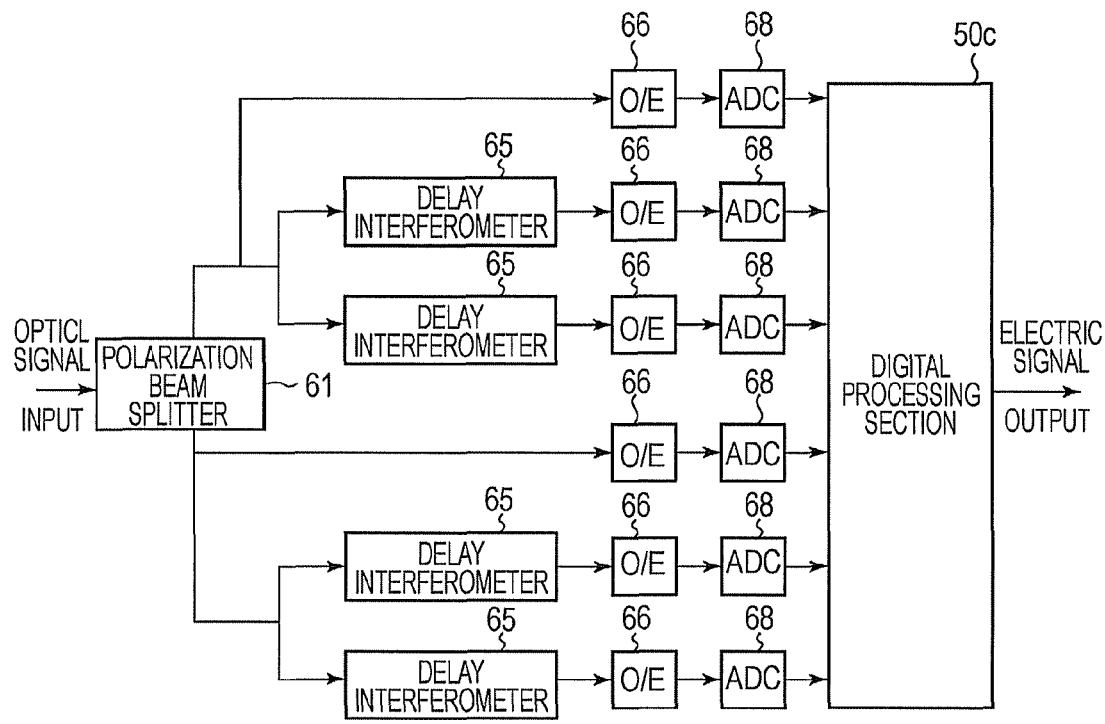
FIG. 17A is a block diagram illustrating an optical reception device according to an embodiment of the present invention.
Figure 17B:
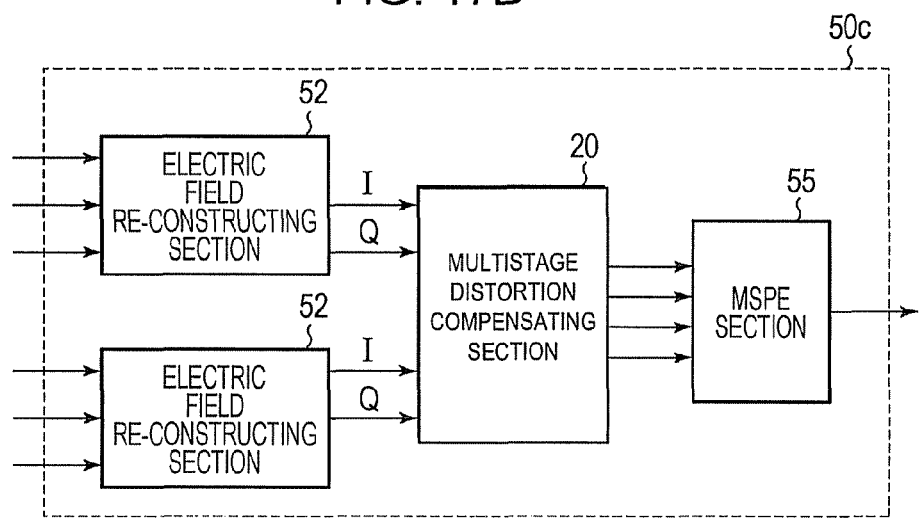
FIG. 17B is a block diagram illustrating the optical reception device according to an embodiment of the present invention

FIG. 17A and FIG. 17B are block diagrams illustrating an example of a polarization diversity self-coherent type optical reception device (a polarization diversity self-coherent type optical receiver) according to an embodiment of the present invention. As illustrated in FIG. 17A, the polarization beam splitter 61 divides an optical signal into optical signals oriented in two polarizing directions. The optical signals so divided are processed using the delay interferometers 65, the O/Es 66 and the ADCs 68 according to an embodiment illustrated in FIG. 16A and are input into a digital processing section 50c. As illustrated in FIG. 17B, the digital processing section 50c includes two electric field reconstructing sections 52, the multistage distortion compensating section 20 and the MSPE section 55. Digital electric signals corresponding to two optical signals which have been divided to be oriented in two polarizing directions are respectively input into the electric field reconstructing sections 52. Each of the electric field reconstructing sections 52 performs a process of reconstructing a complex photoelectric field in the same manner as that has already been explained in the description of the above-described embodiment and outputs processed signals to the multistage distortion compensating section 20. The arrangement other than the above is the same as that in FIG. 16B that illustrates an embodiment and hence description thereof will be omitted. According to an embodiment, a configuration having the multistage distortion compensating section 20 according to an embodiment may be implemented in the polarization diversity self-coherent type optical reception device.

As another embodiment of the present invention, an example in which mutual phase modulation compensation is performed as nonlinear distortion compensation will be described in an embodiment. In subcarrier multiplexing multi-input and multi-output transmission systems, for example, such as an Orthogonal Frequency Division Multiplexing (OFDM) transmission system and a polarization multiplexing transmission system, self phase modulation induced by a self channel (a subcarrier) and inter-channel (inter-subcarrier) mutual phase modulation induced by different channels (for example, neighboring subcarriers) in a received optical signal are generated.

Figure 18:
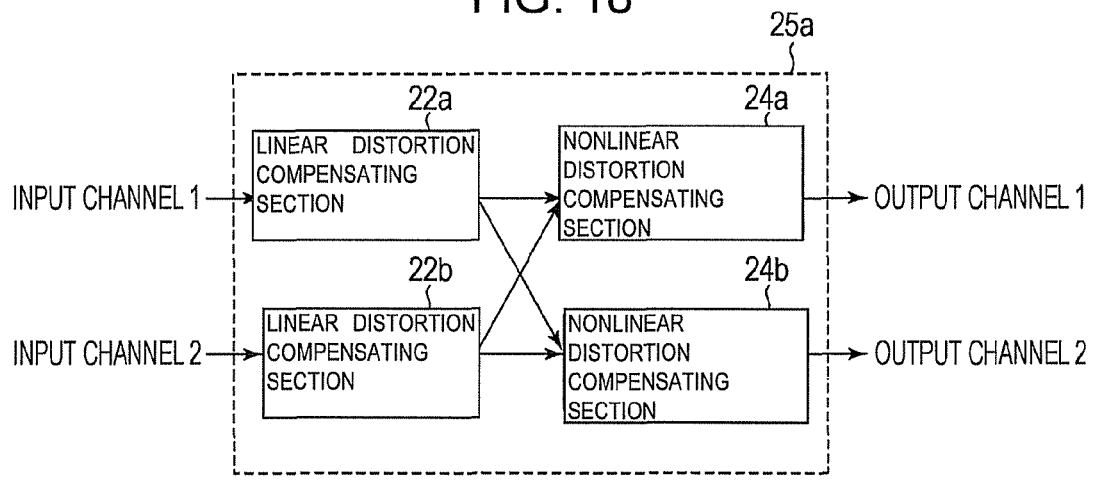
FIG. 18 is a block diagram illustrating a distortion compensating section according to an embodiment of the present invention.

FIG. 18 is a block diagram illustrating a distortion compensating section 25a forming one stage of the multistage distortion compensating section. The distortion compensating section 25a compensates for mutual phase modulation between channels which are greatly mutually phase-modulated. Linear distortion compensating sections (linear distortion compensators) 22a and 22b execute linear distortion compensation respectively based on signals from input channels 1 and 2. A nonlinear distortion compensating section (nonlinear distortion compensator) 24a executes nonlinear distortion compensation processing based on signals sent from the linear distortion compensating sections 22a and 22b and outputs a processed signal to an output channel 1. The nonlinear distortion compensating section (nonlinear distortion compensator) 24b executes nonlinear distortion compensation processing based on signals sent from the linear distortion compensating sections 22a and 22b and outputs a processed signal to an output channel 2.

Figure 19:
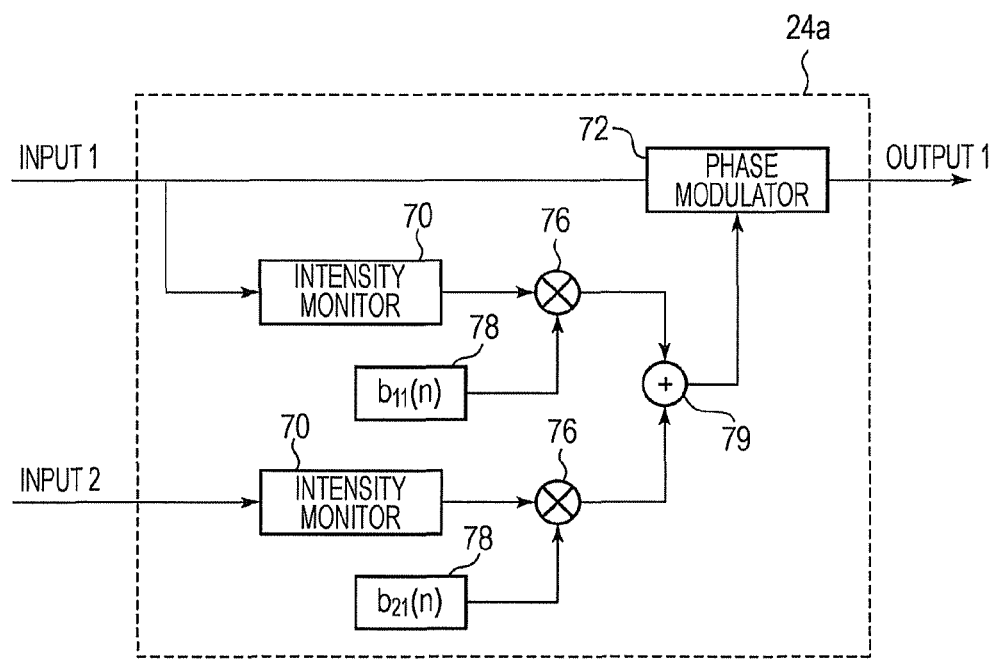
FIG. 19 is a block diagram illustrating a nonlinear distortion compensating section according to an embodiment of the present invention.

FIG. 19 is a block diagram of the nonlinear distortion compensating section 24a. In FIG. 19, the nonlinear distortion compensating section 24a has the intensity monitors 70, the nonlinear coefficients 78 and the integrators 76 respectively corresponding to inputs 1 and 2, and an adder 79. In signals sent from the inputs 1 and 2, the coefficient b11(n) and the coefficient b12(n) are multiplied to their intensities as in the case in FIG. 11 illustrating an embodiment. The coefficient b11(n) or b12(n) is set in the same manner as that using the numerical formula 2. The adder 79 adds corresponding signals to the inputs 1 and 2 and outputs a result of addition to a phase modulator 72. The phase modulator 72 modulates the phase of the signal from the input 1 based on an output from the adder 79 and outputs the phase-modulated signal as an output 1. As described above, mutual phase modulation compensation may be realized by performing distortion compensation on the signal from the input 1 based on a signal obtained by multiplying the intensities of the signals from the inputs 1 and 2 and nonlinear coefficients and adding together results of multiplication.

Although the above-described embodiment is of an example of performing mutual phase modulation compensation on two channels, mutual phase modulation compensation may be also performed on three or more channels according to an embodiment. As an alternative, all the nonlinear distortion compensating sections 24 of the multistage distortion compensating section 20 illustrated in FIG. 8 may be formed as nonlinear distortion compensating sections that perform mutual phase modulation compensation. Likewise, some of the nonlinear distortion compensating sections 24 may be formed as nonlinear distortion compensating sections that perform mutual phase modulation compensation. As mentioned above, at least one of the nonlinear distortion compensating sections 24 may be formed as a nonlinear distortion compensating section that compensates for phase modulation distortion exerted on one of a plurality of signals which have been input thereinto, based on the intensity of each of the plurality of signals. As a result, mutual phase modulation compensation may be realized.

Figure 20:
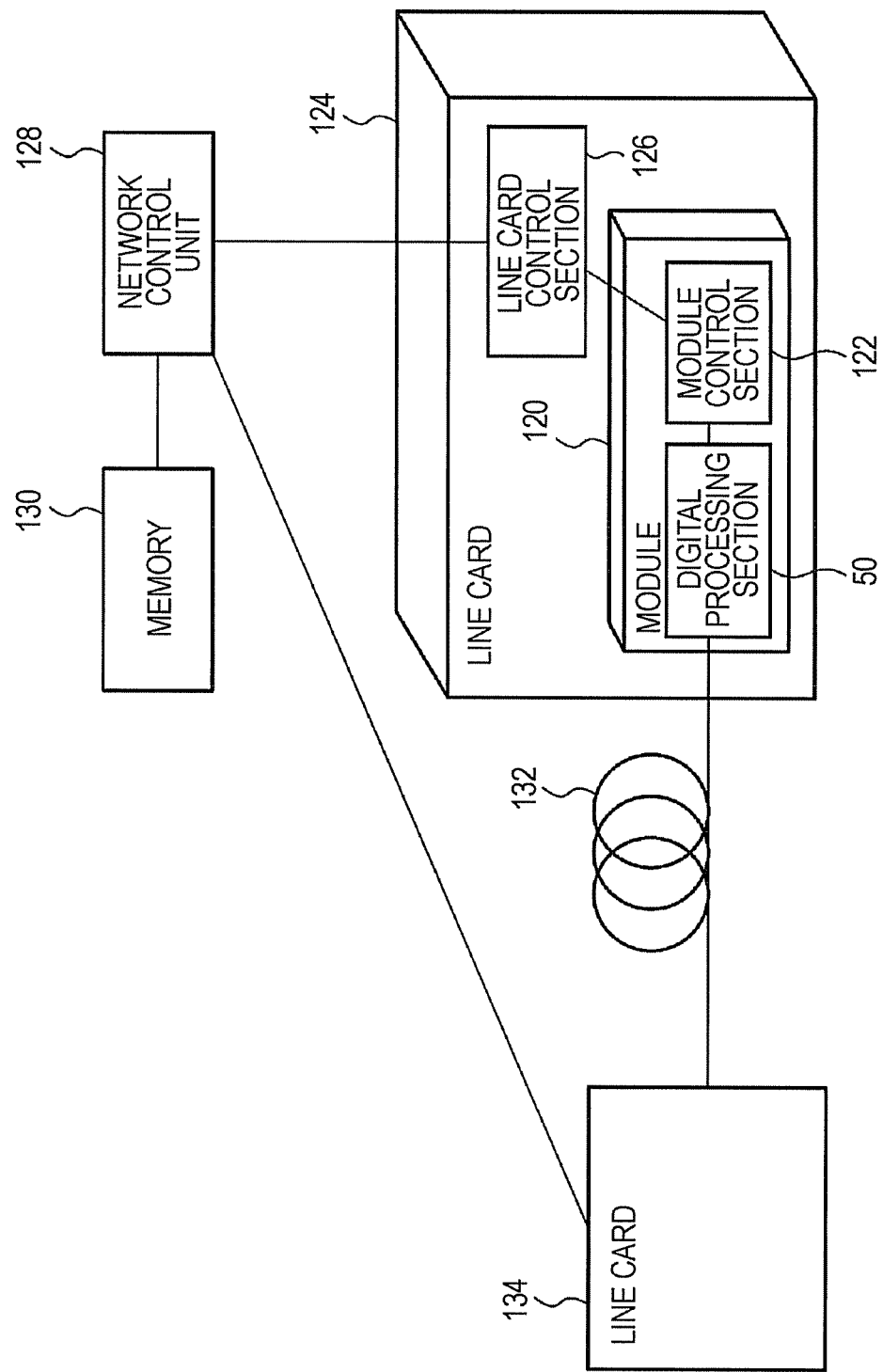
FIG. 20 is a block diagram illustrating a transmission system according to an embodiment of the present invention.

An embodiment is of an example of a system that performs control of coefficients of distortion compensation (for example, the coefficient Ck(n) in FIG. 9, the coefficient b(n) in FIG. 11 and the coefficients b11($n$) and b12($n$) in FIG. 19) used in the linear distortion compensating section 22 and the nonlinear distortion compensating section 24 in the multistage distortion compensating section 20. FIG. 20 is a diagram illustrating an optical transmission system according to an embodiment of the present invention. In FIG. 20, an optical transmission line card 134 acting as an optical transmission device and an optical reception line card 124 acting as an optical reception device (an optical receiver) are installed at both ends of an optical transmission line 132 including transmission spans. In place of the optical reception line card 124, an optical transmission/reception line card having an optical transmitting/receiving function may be installed. A network control unit 128 is a computer that performs, for example, optical transmission line link/network management and controls the operations of the optical transmission line card 134 and the optical reception line card 124. A memory 130 is, for example, a transmission fiber/chromatic dispersion compensation module database, and stores data sent from the network control unit 128 and outputs data to the network control unit 128.

The optical reception line card 124 has an optical receiving module 120 and a line card control section 126 controlling the operation of the optical receiving module 120. The optical receiving module 120 has the digital processing section 50 and a module control section 122. The digital processing section 50 is formed, for example, by one chip. The optical receiving module 120 also has functional elements other than the digital processing section 50, for example, illustrated in FIG. 14, though not illustrated in FIG. 20.

Figure 21:
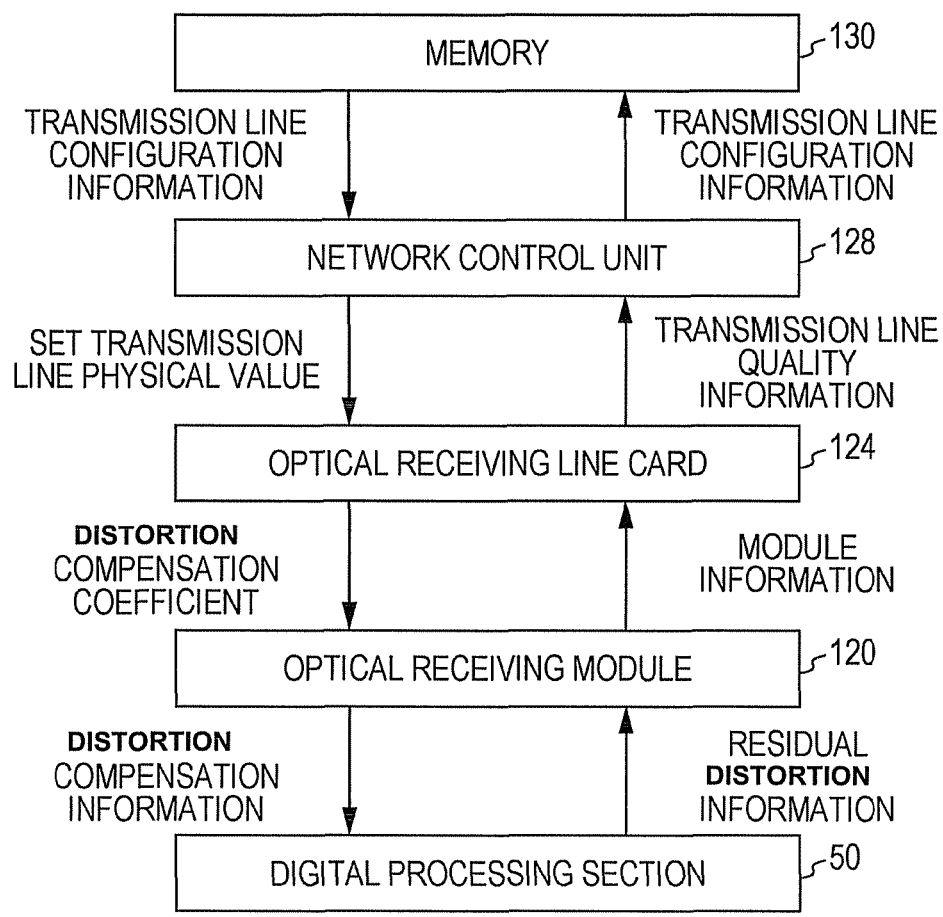
FIG. 21 is a block diagram illustrating flows of respective pieces of information.

FIG. 21 is a diagram illustrating a manner of inputting information into the digital processing section 50, the optical receiving module 120, the optical reception line card 124, the network control unit 128 and the memory 130 and outputting information therefrom. The network control unit 128 controls the memory 130 to store transmission line configuration information. The transmission line configuration information is information on respective configurations of the optical transmission line 132, that is, information on, for example, the number of spans, a length of each optical transmission line in each transmission span and kinds of the optical fiber, the optical amplifier and the chromatic dispersion compensating module which are used for data transmission.

The network control unit 128 calculates setting transmission line physical values based on the transmission line configuration information and outputs the calculated physical values to the line card control section 126 of the optical reception line card 124. The setting transmission line physical values are physical values used for setting coefficients used in the multistage distortion compensating section 20, that is, physical values used to calculate, for example, the coefficients Ck(n) and b(n) using the numerical formulae 1 and 2 such as, for example, the distortion coefficient γ(z) and the optical signal power p(z). These physical values are, for example, functions of temperature. Thus, the network control unit 128 obtains information, for example, on a current temperature of each transmission span and calculates the distortion coefficient γ(z) and the optical signal power p(z) based on the information.

The line card control section 126 of the optical reception line card 124 calculates distortion compensation coefficients, that is, coefficients used to perform distortion compensation based on the setting transmission line physical values. The distortion compensation coefficients are, for example, the coefficient Ck(n) in FIG. 9, the coefficient b(n) in FIG. 11 and the coefficients b11($n$) and b12($n$) in FIG. 19. The line card control section 126 outputs the distortion compensation coefficients to the module control section 122 of the optical receiving module 120. The module control section 122 outputs the distortion compensation coefficients to the multistage distortion compensating section 20 of the digital processing section 50. The multistage distortion compensating section 20 compensates for distortion based on the distortion compensation coefficients.

The digital processing section 50 outputs residual distortion information to the module control section 122 of the optical receiving module 120. The residual distortion information is information on nonlinear distortion (for example, expressed by the numerical formula 3) or linear distortion which still remains after distortion compensation has been performed using the multistage compensating section 20 and is monitored using the NL monitoring section 56 and the CD monitoring section 58 (see FIG. 12) of the digital processing section 50. The module control section 122 of the optical receiving module 120 outputs information which has been monitored using other circuits installed in the optical receiving module 120 as module information to the line card control section 126 of the optical reception line card 124 together with the residual distortion information. The line card control section 126 of the optical reception line card 124 outputs information which has been monitored using other circuits installed in the optical reception line card 124 as transmission line quality information to the network control unit 128 together with the module information.

Figure 22:
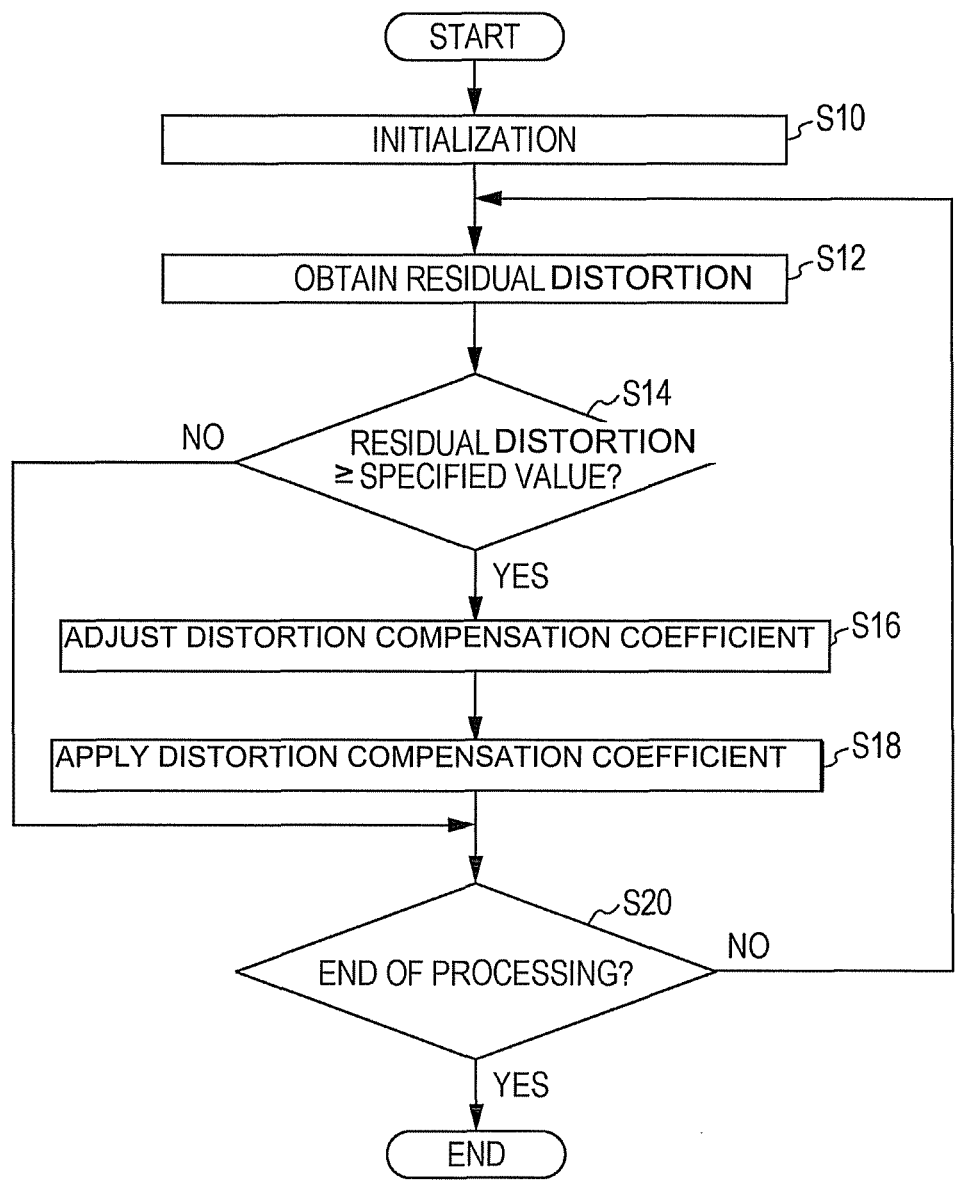
FIG. 22 is a diagram illustrating a processing method performed using a line card control unit.

FIG. 22 illustrates a method of explaining a process performed using the line card control section 126. In FIG. 22, the line card control section 126 performs initialization (operation S10). As described in relation to FIG. 21, the line card control section 126 calculates the distortion compensation coefficients and applies the calculated distortion compensation coefficients to the multistage distortion compensating section 20. The line card control section 126 obtains the residual distortion information (operation S12). The line card control section 126 judges whether the residual distortion is equal to or more than a specified value (operation S14). When No, the process proceeds to operation S20. When Yes, the line card control section 126 resets the distortion compensation coefficients (operation S16). The line card control section 126 applies the distortion compensation coefficients to the multistage distortion compensating section 20 (operation S16). The line card control section 126 judges whether the process is terminated. When Yes, the process is terminated. When No, the process returns to operation S12. Although an example in which the line card control section 126 calculates the distortion compensation coefficients is illustrated in FIG. 22, as an alternative, the module control section 122 may calculate the distortion compensation coefficients or the line card control section may calculates the nonlinear coefficient B(n) and the chromatic dispersion amount D (see the numerical formula 1) and the module control section 122 may calculate the linear coefficient Ck(n).

According to an embodiment, the line card control section 126 or the module control section 122 changes a parameter (a coefficient of distortion compensation) used for at least one of distortion compensating operations performed using the linear distortion compensating section 22 and the nonlinear compensating section 24 based on information on distortion remained in a signal to be output from the multistage distortion compensating sections 20. As a result, it may become possible to change the distortion compensation coefficient so as to reduce the residual distortion.

The preferred embodiment(s) of the present invention have been described in detail. However, the present invention may not be limited to specific embodiments and the present invention may be modified and altered in a variety of ways within the scope of the gist of the present invention described in the appended claims.

Highly accurate nonlinear distortion compensation may be realized by using the distortion compensator, the optical reception device, the distortion compensator and optical reception device controlling methods and the optical transmission system according to the embodiments of the present invention.

A compensator is provided with a configuration in which each of a plurality of distortion compensating sections has linear distortion compensating sections compensating for linear waveform distortion exerted on the optical signal and nonlinear distortion compensating sections compensating for nonlinear waveform distortion exerted on the optical signal. The method and system disclosed herein include selectively alternating between compensating for nonlinear distortion and linear distortion relative to an optical signal over plurality of spans.

The embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An apparatus, comprising:
    linear distortion digital compensators that each compensate linear distortion of an input channel signal, compensated channel signals being output from the linear distortion digital compensators; and
    nonlinear digital distortion compensators that each input the compensated channel signals output from different one of the linear distortion digital compensators, and compensate nonlinear distortion, based on the compensated channel signals.

2. The apparatus according to claim 1, wherein
    each of the nonlinear compensators comprising:
        intensity monitors that monitor different one of the compensated channel signals output from the linear distortion digital compensators,
        multipliers that multiply a channel signal output from different one of the intensity monitors by one of nonlinear coefficients corresponding to the different one of the intensity monitors; and
        a phase modulator that modulates a phase of a predetermined channel signal of the compensated channel signals based sum of products of the multipliers.

3. The apparatus according to claim 1, wherein
    a number of the linear distortion digital compensators is two, one of the linear distortion digital compensators compensating a channel signal of a polarization multiplexed optical signal,
    and the other of the linear distortion digital compensators compensating the other channel of the polarization multiplexed optical signal, and
    a number of the nonlinear digital distortion compensators is two, the two nonlinear digital distortion compensators corresponding to the channel and the other channel of the polarization multiplexed optical signal.

4. The apparatus according to claim 1, further comprising:
    a polarization beam splitter that separates an input optical signal into a first polarized optical signal and a second optical signal; and
    analog-digital-converters that converts input analog electrical signals into the input channel signals, the input analog electrical signals being generated based on the optical signals by using photoelectric converters, the optical signals being generated by a first 90° hybrid that mixes the first polarization optical signal and a local light output from a local optical oscillator and a second 90° hybrid that mixes the second polarization optical signal and the local light.

5. An optical receiver, comprising:
    a polarization beam splitter that separates an input optical signal into a first polarized optical signal and a second polarized optical signal;
    an oscillator configured to output a local oscillator light;
    two optical hybrids that mix the first polarized optical signal and the second polarized optical signal with the local oscillator light output from the oscillator;
    photoelectrical converters that each convert different one of the mixed optical signals related to the first polarized optical signal and the second polarized optical signal into analog electrical signals;

analog-digital-converters that each convert different one of the analog electrical signals into digital channel signals;

linear distortion digital compensators that each compensate linear distortion of different one of the digital channel signals and output compensated digital channel signals; and nonlinear digital distortion compensators that each input compensated digital channel signals output from different one of the linear distortion digital compensators, and compensate nonlinear distortion, based on the compensated channel signals.

6. A method of an optical receiver, comprising:

compensating linear distortion of input signals from respective channels, and outputting compensated signals of the respective channels; and performing nonlinear distortion compensation on both of the compensated signals output, using each of nonlinear digital distortion compensators, and providing output channel signals to different output channels.

* * * * *

UNITED STATES PATENT AND TRADEMARK OFFICE
CERTIFICATE OF CORRECTION

PATENT NO.         : 8,805,207 B2
APPLICATION NO.    : 13/764299
DATED              : August 12, 2014
INVENTOR(S)        : Takahito Tanimura et al.

It is certified that error appears in the above-identified patent and that said Letters Patent is hereby corrected as shown below:

On the Title Page, Column 2, Item [56] (Other Publications), Line 1, Delete
""EiectronicPost-compensation" and insert -- "Electronic Post-compensation --, therefor.

Signed and Sealed this
Twenty-third Day of December, 2014

Michelle K. Lee
*Deputy Director of the United States Patent and Trademark Office*